United States Patent [19]

Christen et al.

[11] Patent Number: 5,230,685
[45] Date of Patent: Jul. 27, 1993

[54] MACHINE TOOL FOR MACHINING PRINTED CIRCUIT BOARDS

[75] Inventors: Erich Christen, Bueren; Pierre-Andr',acu/e/ Lautenschlager, Preles, both of Switzerland

[73] Assignee: Posalux S.A., Bienne, Switzerland

[21] Appl. No.: 766,017

[22] Filed: Sep. 26, 1991

[30] Foreign Application Priority Data

Sep. 28, 1990 [FR] France ................... 90 12093

[51] Int. Cl.⁵ ........................................ B23Q 3/157
[52] U.S. Cl. .................................... 483/55; 408/43; 409/202; 409/212
[58] Field of Search ............... 29/26 A, 568; 408/95, 408/46, 51, 42, 43, 48, 49, 50; 409/202, 212, 107, 109, 235; 483/30, 54, 55, 58

[56] References Cited

U.S. PATENT DOCUMENTS

| | | | |
|---|---|---|---|
| 2,080,643 | 5/1937 | Walther | 408/46 X |
| 2,393,696 | 1/1946 | Kraut et al. | 409/212 X |
| 2,886,988 | 5/1959 | Gordon | 408/46 |
| 3,822,958 | 7/1974 | Lewis | 408/46 |
| 4,088,417 | 5/1978 | Kosmowski | 408/46 X |
| 4,520,551 | 6/1985 | Imhof | 29/568 |
| 4,596,067 | 6/1986 | Raiteri | 29/568 |
| 4,654,956 | 4/1987 | Reed | 29/568 |
| 4,730,373 | 3/1988 | Senoh | 29/26 A |
| 4,786,216 | 11/1988 | Kitagawa et al. | 408/95 X |
| 4,850,754 | 7/1989 | Thornton et al. | 408/46 X |
| 4,865,494 | 9/1989 | Gudow | 408/95 |
| 4,982,831 | 1/1991 | Irie et al. | 408/49 X |
| 5,075,530 | 12/1991 | Lee | 408/42 X |

FOREIGN PATENT DOCUMENTS

| | | |
|---|---|---|
| 3615888 | 12/1987 | Fed. Rep. of Germany . |
| 3719167 | 3/1988 | Fed. Rep. of Germany . |
| 2532226 | 3/1984 | Switzerland . |
| 770674 | 10/1980 | U.S.S.R. ................ 408/43 |

OTHER PUBLICATIONS

"Gridless Printed Circuit Board Drilling Machine", IBM Technical Disclosure Bulletin, Apr. 1989, pp. 242–243.

"Method for Beveling Edges of Populated Printed Wiring Boards and Beveling Machine", IBM Technical Disclosure Bulletin, Jun. 1990, pp. 485–487.

"Rationelles Bohren in Leiterplatten", Erich Christen, Feinwerktechnik & Messtechnik, May 1986, pp. 52–60.

Primary Examiner—William Briggs
Attorney, Agent, or Firm—Weil, Gotshal & Manges

[57] ABSTRACT

A machine tool has a work table movable in a first direction on a frame. Operating units such as drills fitted with rotating tools are mounted on the frame in a manner movable in a direction perpendicular to the said first direction. Means are provided to ensure individual mobility of the operating units namely individual motors incorporated within their casings. The invention is useful in the machining of printed circuits especially by drilling and shaping.

13 Claims, 8 Drawing Sheets

MACHINE TOOL FOR MACHINING PRINTED CIRCUIT BOARDS

FIELD OF THE INVENTION

The present invention relates to machine tools and, in particular, to machine tools designed to carry out machining operations, especially mechanical machining, by removal of shavings from materials in boards of varying thickness. In particular the invention relates to machine tools capable of automatically carrying out drilling, shaping, milling or other operations on printed circuit boards or stacks of such boards.

DESCRIPTION OF THE PRIOR ART

French patent FR-2,616,615 discloses a numerically controlled machine for machining printed circuit boards. This machine essentially comprises a work table which is movable in a first direction, notably along an axis Y, and a plurality of operating units each of which contains a motorized drill adapted to receive a rotating tool to execute a given machining operation.

These operating units are firmly connected to a trolley which is mobile in a second direction perpendicular to the first, notably along an axis X. In addition, the operating units are simultaneously or independently mobile in a third direction perpendicular to the two others, notably along an axis Z.

The operating units are mounted on their common trolley with a fixed distance between the axes which is slightly greater than the maximum width of the printed circuits to be machined, said width being equal to the maximum traverse along the axis X of the trolley carrying the operating units.

Since these operating units of necessity move together along the axis X, their position in relation to the boards to be machined is the same for all of them during each individual machining operation. It is consequently only possible to carry out the same machining pattern (for example a uniform distribution of holes in the case of a drilling function) on all the boards at the same time if the machining operations carried out on the various boards are executed at staggered time intervals. However, selection of this solution obviously reduces the efficiency of the machine since it will not always be possible to work simultaneously on all the boards.

If it is necessary to machine printed circuit boards, the dimensions of which are larger than the distance between the axes of the operating units, it becomes impossible to use all the operating units simultaneously because the printed circuit boards overlap the scannable surface of neighbouring operating units, with the result that, in this case, the production capacity of the machine is also considerably reduced.

Finally, if it is intended to machine printed circuit boards, the dimensions of which are less than the distance between the axes of the operating units, the entire available surface scanned by each operating unit is not used, with the result that, in this case as well, the machine is not utilized to the best of its potential capacity.

The current trend in machining and, in particular, in drilling, shaping and milling printed circuit boards, is to be able to machine series of different shapes as quickly as possible on the same machine, or to mix several sizes of different boards also requiring different machining patterns in the same batch of boards to be machined. It is thus an object of the present invention to meet this need of the printed circuit industry.

French patent FR-2,532,226 discloses a machine tool in which the distance between the axes of the operating units is adjustable in advance, i.e. once and for all before the machine is started up for a given job. However, it follows that this mode of assembly which leads to a fixed distance between the axes cannot help to solve the problem which forms the basis of the present invention, because a specialist is needed to carry out various fitting operations, such as screwing, precise adjustment, etc. to obtain the new distance between the axes of the operating units.

OBJECTS OF THE INVENTION

It is an object of the invention to provide a machine tool notably for machining printed circuit boards, capable of working on boards of any dimensions that can be different for the various operating units which the machine comprises, machining always being possible with maximum efficiency and speed as a function of the various machining parameters desired.

BRIEF SUMMARY OF THE INVENTION

It is thus an object of the invention to provide a machine
tool, in particular for machining printed circuits by drilling, milling, shaping and the like, comprising:
a frame
a work table mounted so as to be mobile in at least a first direction on the said frame,
first motor means adapted to move the work table,
at least two operating units adapted to receive tools selectively so as to carry out said machining operations,
means to guide said operating units in relation to the frame in a second direction perpendicular to said first direction
sliding means cooperating with said guide means and supporting said operating units to enable them to move in said second direction
and second motor means coupled to said sliding means to ensure the movements of said operating units,
said sliding means comprising sliding units associated with each respective operating unit and
where said second motor means have as many independent motor control units as there are operating units.

It follows from these characteristics that the distance between the axes of the operating units can be dynamically adjusted during the machining operations, resulting in quite remarkable flexibility of use. In this manner it is possible to work with circuit boards of any dimensions whatsoever, it being possible to choose their length in the second direction as desired (within the width restrictions of the machine itself, of course).

It follows, for example, that to work on a board the lateral dimension of which (that is, along the second direction) exceeds the distance between the axes of two adjacent units, it is possible to machine these units simultaneously on the same board because the "scanning" pattern of the board for each operating unit could be chosen and controlled in a manner totally independent of the patterns of the other units.

If, on the other hand, it is necessary to machine boards of short lateral length or boards which will ultimately be totally different from one another, it is possible to control the units without their having to wait for each other to carry out their work.

However, in the machine tool of the invention, it is also perfectly possible to work according to the classic principle of rigid coupling of the movements of the operating units. Here again, it is sufficient to control their movements accordingly.

According to another advantageous feature of the invention the slide units associated with each operating unit project laterally from a casing accommodating the operating unit, the casing being designed so as to provide clearance spaces in which the slide units of adjacent operating units can overlap.

A distance between the axes between the adjacent operating units is thus obtained which can be reduced to a value smaller than the modular dimensions conventionally used in printed circuit technology, said modular dimension currently being equal to 6 inches (about 154 mm). The machine consequently makes it possible to work simultaneously on several circuits having this minimal modular dimension.

BRIEF DESCRIPTION OF THE DRAWINGS

Other features of the invention will emerge from the following detailed description with reference to the appended drawings given solely by way of example in which.

DETAILED DESCRIPTION OF THE INVENTION

Figure 1:
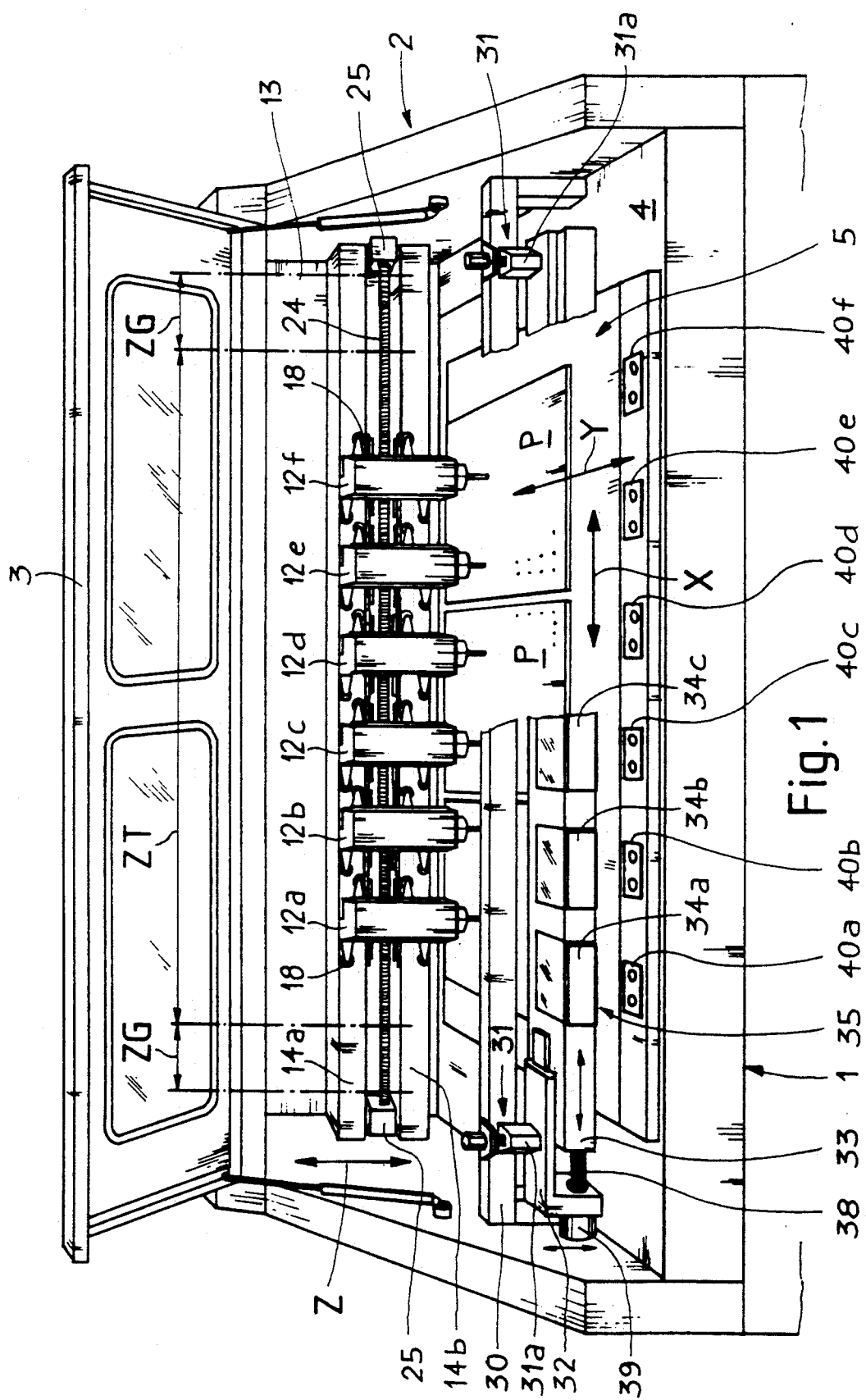
FIG. 1 shows a front perspective view of a machine tool of the invention.

FIG. 1 shows a general view of the machine tool of the invention which comprises a frame 1 surmounted by a casing 2 provided with a cover 3 which can be opened to provide access to the main parts of the machine.

The frame 1 defines a work surface 4 on which it is possible to move a work table 5 in a direction oriented from front to back, this direction being called Y (i.e. the first direction) in the following description.

It should be noted that the horizontal direction (i.e. the second direction) perpendicular to the direction Y will be termed direction X, the vertical direction being termed direction Z.

Figure 2:
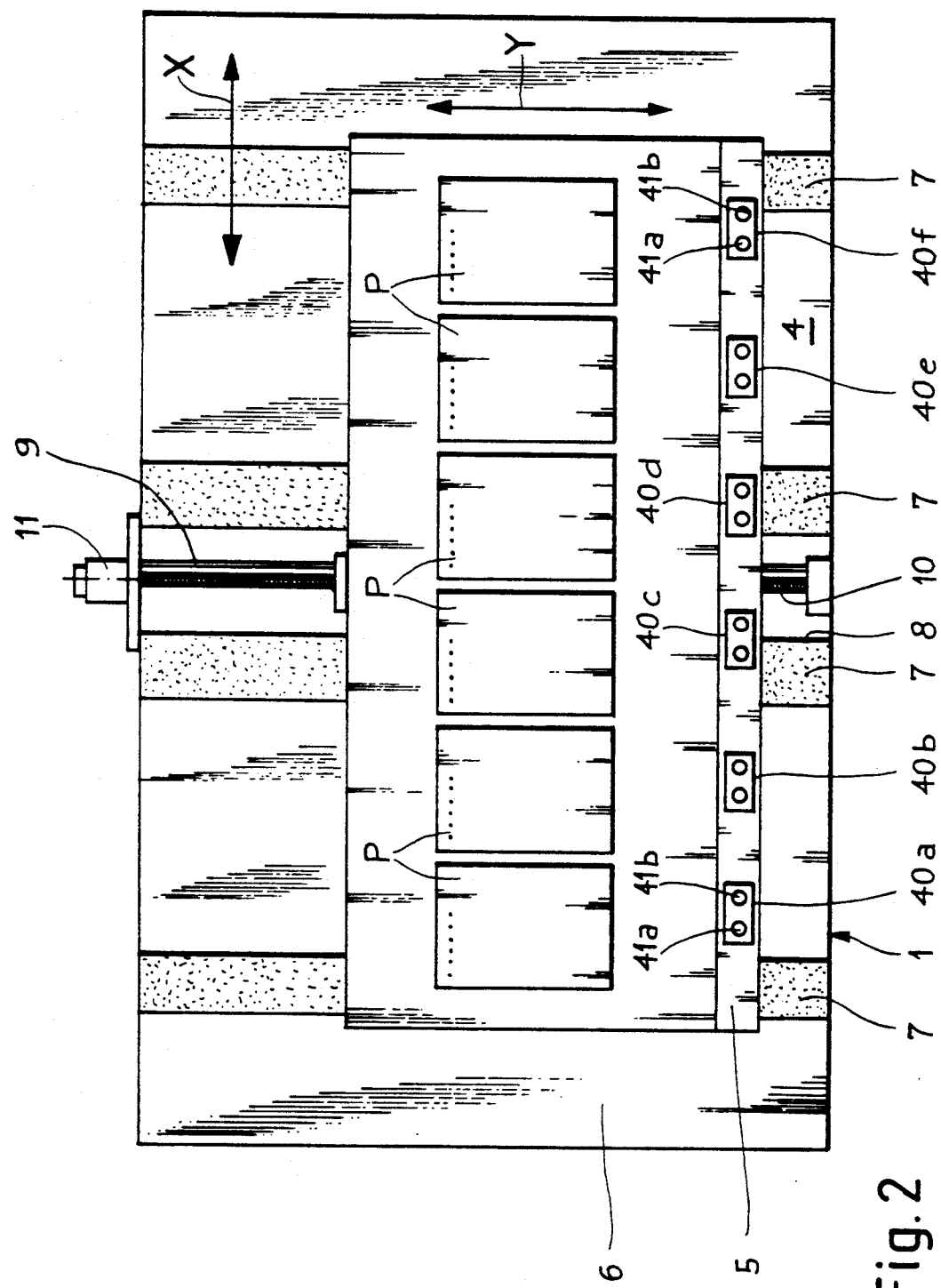
FIG. 2 is a plan view of the work table of this machine, mounted on a frame.

FIG. 2 shows diagrammatically that the frame 1 is formed of a massive block 6 of concrete polymer, for example, in which several slide paths 7 are arranged parallel to direction Y, the upper surfaces of which are flush with the work surface 4 and which can be made using granite rods. A central groove 8 is provided in the centre of the work surface 4 in the direction Y. This receives a positioning scale 9 cooperating with a meter, for example a photoelectric meter (not shown) which makes it possible to accurately position the table 5 at any location along direction Y. An endless screw 10 cooperates with a positioning nut (also not shown) integral with the table, the endless screw being driven by a motor 11.

The work table 5 is also provided with means (that are known per se and not shown) adapted to fix the pieces to be machined which, in the case described herein, are composed of printed circuit boards P or of stacks of boards of this kind.

Figure 3:
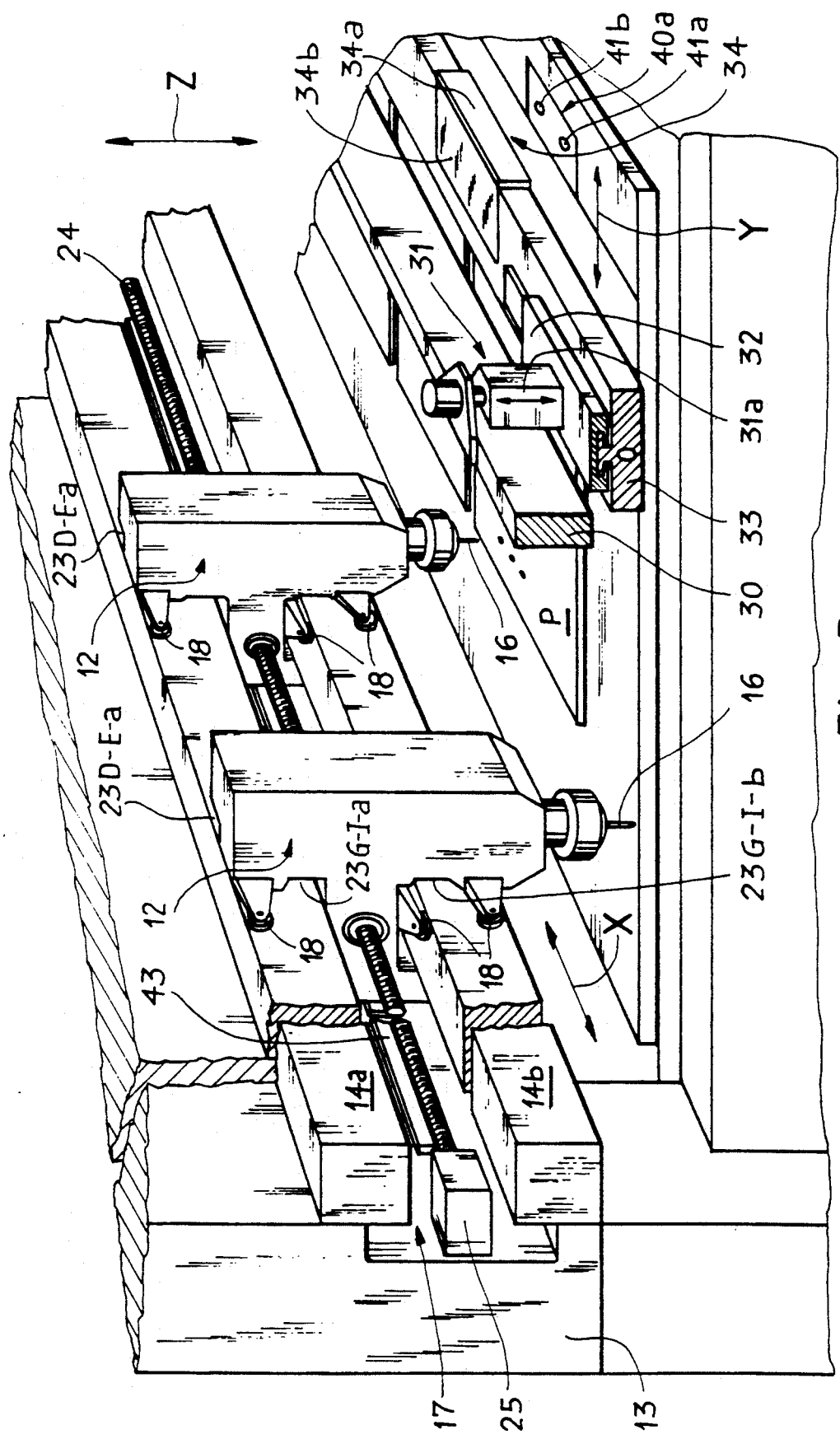
FIG. 3 is a larger scale perspective view of part of the machine showing in particular the operating unit support.
Figure 4:
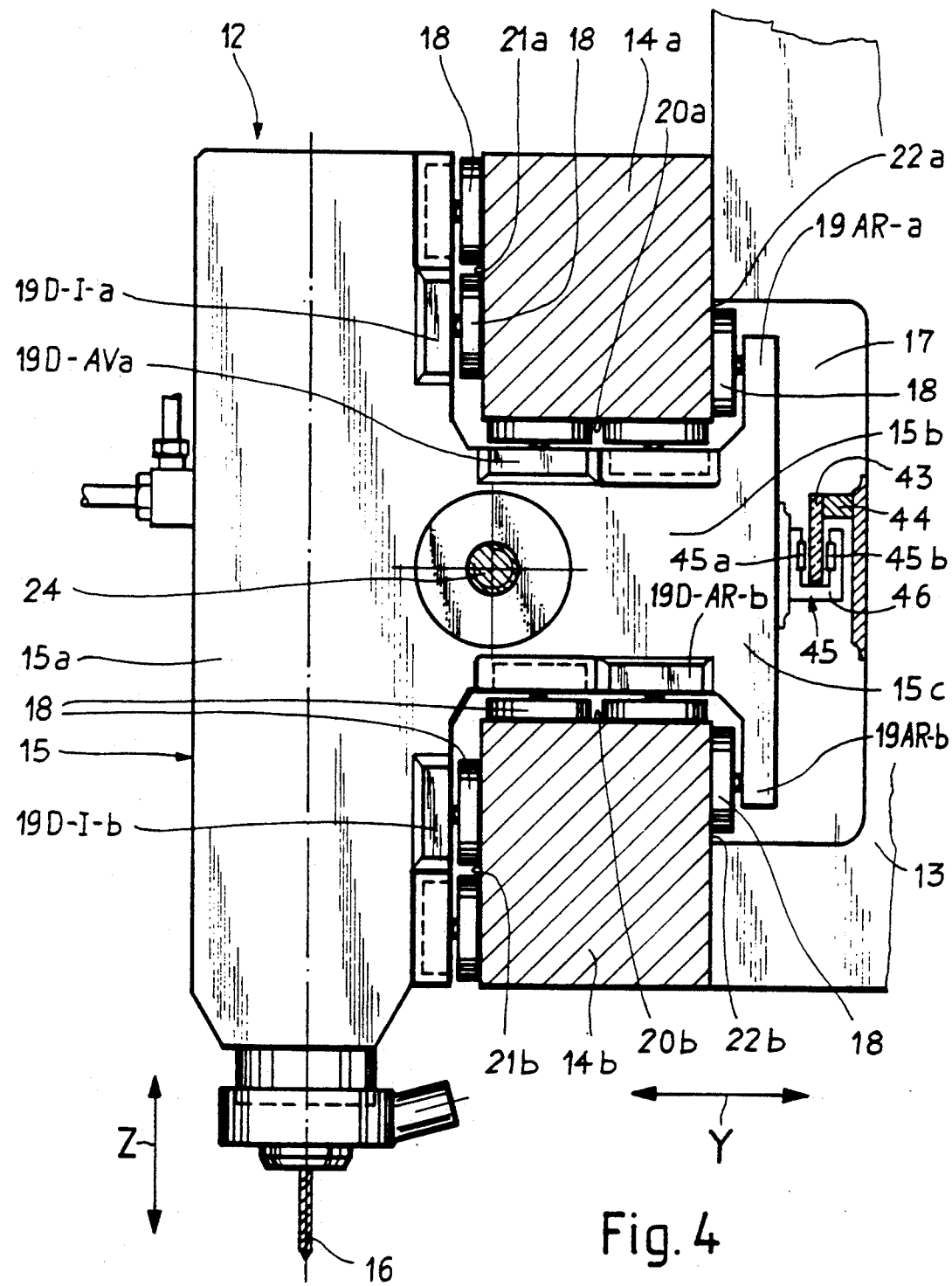
FIG. 4 is an elevation at an even larger scale, partially in section, of a operating unit, the figure showing in particular the mode of support of this operating unit.

FIGS. 1, 3 and 4 show more specifically that the machine of the invention has operating units 12 (given reference numerals 12a to 12f on FIG. 1) which are movably mounted along the direction X. For this purpose the frame 1 has a C-shaped vertical support 13 having support beams 14a and 14b serving as slides for the operating units 12a to 12f.

The operating units, six of which are shown here, but the number of which may be larger or smaller, depending on the size of the machine, each have a substantially H-shaped drill (not shown) located in a casing 15 (see FIG. 4). This drill, the construction of which is known per se, is designed to rotatably drive a tool 16 at high speed which can be a drill, a cutter or any other tool needed for work on work pieces. The drill can, for example, move vertically to carry out drilling operations.

Figure 6:
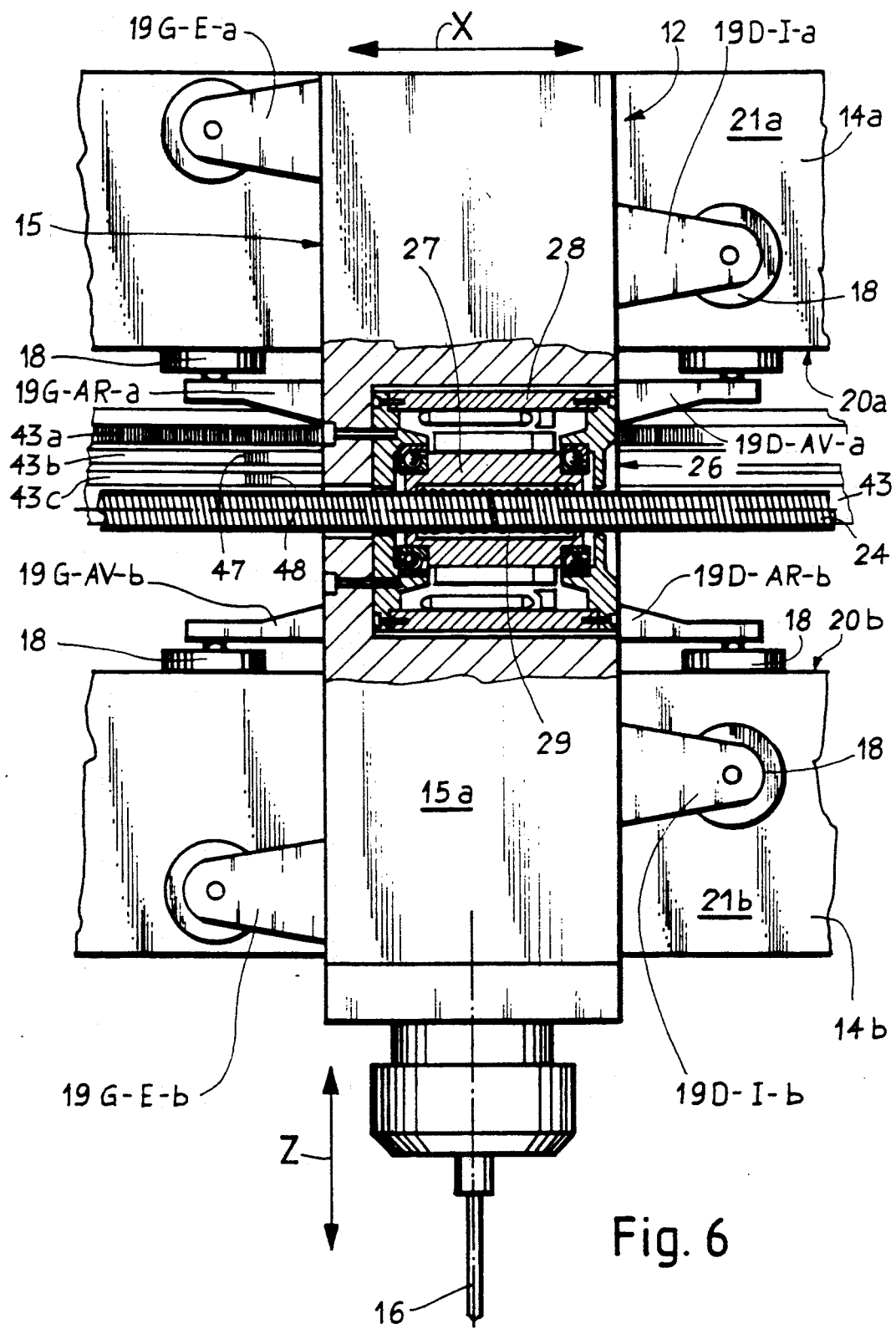
FIG. 6 is a view to the same scale as FIG. 4 of a work unit, the figure showing in partial section the motor means driving this operating unit.

FIGS. 4 and 6 show that the casing 15 of each work unit has a front part 15a of substantially rectangular horizontal section having a support arm 15b extending towards the back which ends in a vertical board 15c, the edges of which are located in a back channel 17 extending horizontally in the direction X. This channel 17 is delimited by the support 13 and the support beams 14a and 14b, as clearly shown in FIG. 4.

The casing 15 of each drill also has several support lugs the ends of which are provided with runners 18 to which compressed air is applied, making it possible to create a cushion of air between the corresponding runner and the support beams 14a and 14b which eliminates friction during movements of the operating unit. It should be noted that identical runners (not shown) are used to support the work table 5 above the slide paths 7 (FIG. 2).

The support lugs are distributed in the following manner:

four horizontal lugs, two on the left (FIG. 6) with reference numerals 19G-AR-a and 19G-AV-b and two on the right with reference numerals 19D-AV-a and 19D-AR-b. The runners 18 of these lugs bear against the corresponding horizontal faces 20a and 20b of the beams 14a and 14b, four front vertical lugs and, more specifically, two lugs to the left and external 19G E-a and 19G-E-b and two lugs to the right and internal, namely 19D-I-a and 19D-I-b. The runners 18 of these lugs bear against the front faces 21a and 21b of the beams 14a and 14b respectively, four back vertical lugs, two of which (19-AR-a) bear against the rear vertical face 22a of the beam 14a and the two other of which (19 AR-b) bear against the back vertical face 22b of the beam 14b. These lugs are in fact defined by the angle areas of the back board 15c of the casing 15 of each operating unit 12.

Figure 5:
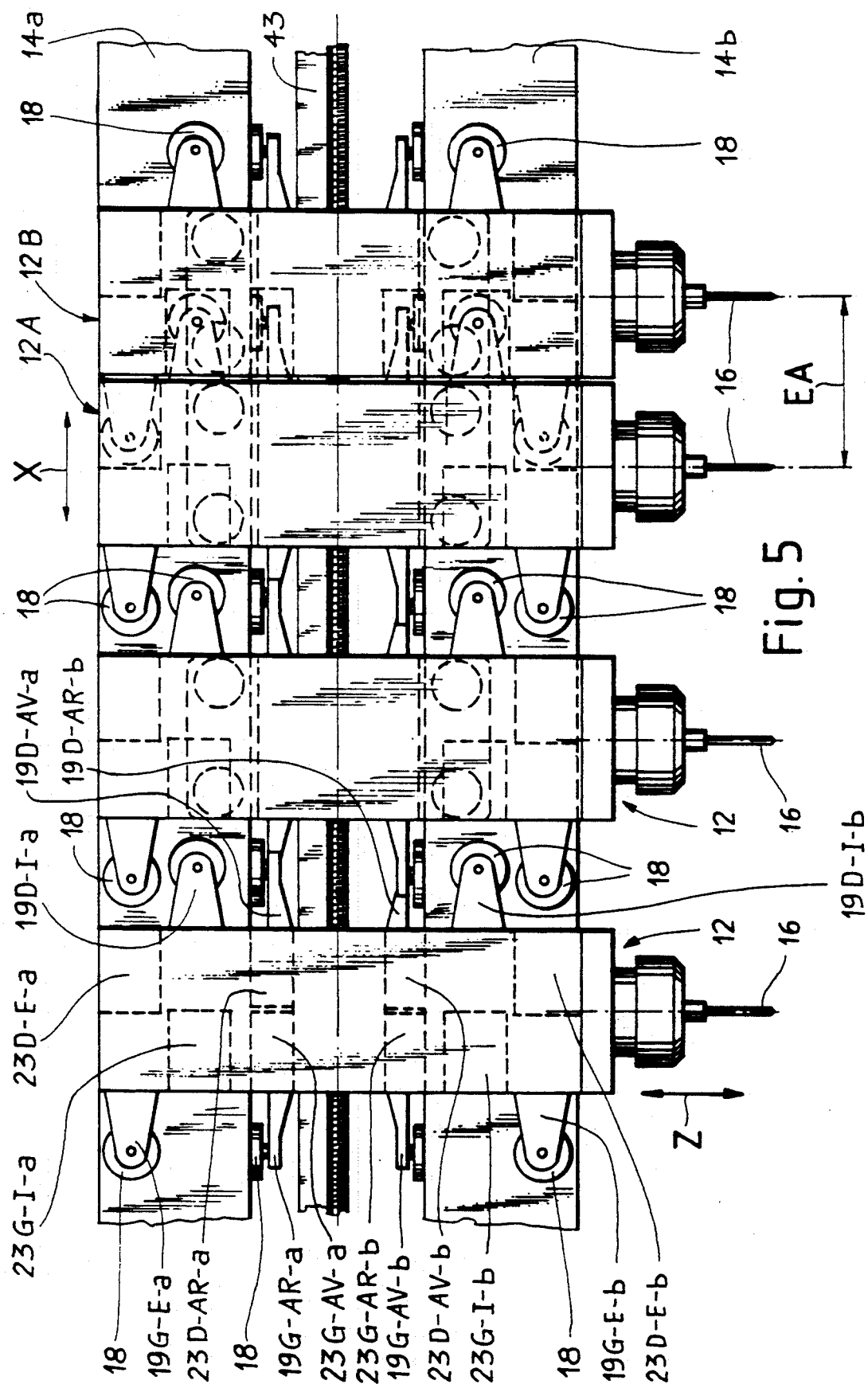
FIG. 5 is an elevation of four operating units and of their slide means.

It will be noted that the casing 15 is so designed that it can accommodate the support lugs of neighbouring operating units when these are brought as close together as possible, as shown on the right of FIG. 5. These clearances are not needed for the runners 18 which are applied against the back faces 22a and 22b of beams 14a and 14b, since these runners penetrate the perimeter back face of the parallelipipedal housing formed by the casing 15.

Each operating unit therefore has the following clearances: (FIG. 5):

four horizontal clearances with reference numerals 23G-AV-a, 23D-AR-a, 23G-AR-b and 23D-AV-b, and four vertical clearances with reference numerals 23G-I-a, 23D-E-a, 23G-I-b and 23D-E-b.

Considering the right half of FIG. 5, it will be noted that, due to the special shape of the casings 15, the support lugs penetrate the adjacent operating units, whilst still guaranteeing very good spatial stability of the units due to maximum distance from their points of support.

It follows that the distance between the axes EA of the tools 16 of two contiguous operating units (12A and 12B, for example in FIG. 5) can be reduced to a minimum, that is virtually to a value slightly below the standardized minimum module of printed circuit cards (currently six inches or 154 mm).

FIGS. 3 and 6 also show that, according to a particularly preferred embodiment of the invention, the operating units all cooperate with the same reaction member which in this case is the same endless screw 24 of the "ballscrew" type which extends horizontally at least over the entire width of the work area of the machine between the beams 14a and 14b, whilst still being fixedly mounted in the terminal consoles 25 integral with the vertical support 13. Each operating unit 12 has its first reaction motor 26 with a rotor 27 and a stator 28, the rotor being engaged by an interior boring 29 provided with balls with the screw 24, whereas the stator 28 is fixedly mounted in the casing 15 of the operating unit. The motor preferably takes the form of an electric motor.

Since each motor can be individually driven, movement in direction X of the operating units is completely independent, it being possible to vary their mutual spacing in a dynamic manner as a function of the milling programme to be carried out.

In the embodiment described, the screw 24 advantageously exceeds the width of the work area ZT of the machine, thereby making it possible to set aside one or several units in the parking areas ZG whilst the working programme temporarily inactivates them (FIG. 1). An area of this kind can of course be provided either on both sides or on only a single side of the machine.

The invention is not limited to the drive means of the units that have just been described. It is thus possible to use another reaction member apart from the screw 24 and another type of motor means equipping each unit, the essential factor being that the motor force is created within the unit itself and "acts" on the reaction member common to all the units.

Nonetheless, at the cost of surrendering this specific advantage, the invention also extends to cover constructions in which the independence of the movements of the operating units could be assured by motor means totally independent of one another and thus having an individual reaction member for each operating unit.

With regard to the individual movements in the direction X of the operating units 12a to 12f, the machine is provided with an incremental linear positioning system, making it possible to position the units in the direction X, not only in relation to the table 5, but also in relation to each other.

This system notably comprises an incremental measuring scale 43 which is fixedly mounted on the vertical support 13 in the back channel 17. This extends parallel to the screw 24 and is of the same length.

FIG. 4 shows that the scale 43 is fixed to brackets 44 provided at different points in the channel 17. This is transparent and cooperates with a photoelectric meter 45 mounted on each operating unit 12a to 12f. In a manner known per se, the meter has a stirrup 46, in the branches of which are a light source 45a and a photoelectric cell 45b respectively.

The scale 43 (FIG. 6) has a first graduation 43a formed by regularly spaced markings along the entire length of the scale. This graduation permits the precise positioning of the operating units in relation to their predetermined rest positions also fixed by the scale 43. For this purpose it has a second graduation 43b formed by as many rest reference positions 47 as there are operating units. In the case of the machine described, there are thus six reference marking positions 47 regularly spaced along the scale 43. A third graduation 43c allocates, by a code defined at 48, a serial number to each reference marking 47 characteristic for the operating unit corresponding to this rest position. The operating units are systematically brought to their rest positions when the machine starts up.

It will thus be noted that, according to an important feature of the invention, the positioning of the operating units along the direction X is based on one and the same reference scale. Apart from the simplicity of construction, this positioning system has the advantage that each operating unit can, from its own rest position, be positioned at any point along the direction X provided the other units do not obstruct it, it being possible to achieve this positioning with an accuracy which does not depend on the accuracy of positioning of the other operating units. The situation would be different if each operating unit had its own positioning scale independent of that of the other units. Nonetheless, in the general scope of the invention, a solution of this kind could be considered without losing the benefit of the advantages linked to the independent and dynamic positioning of the operating units.

Figure 7:
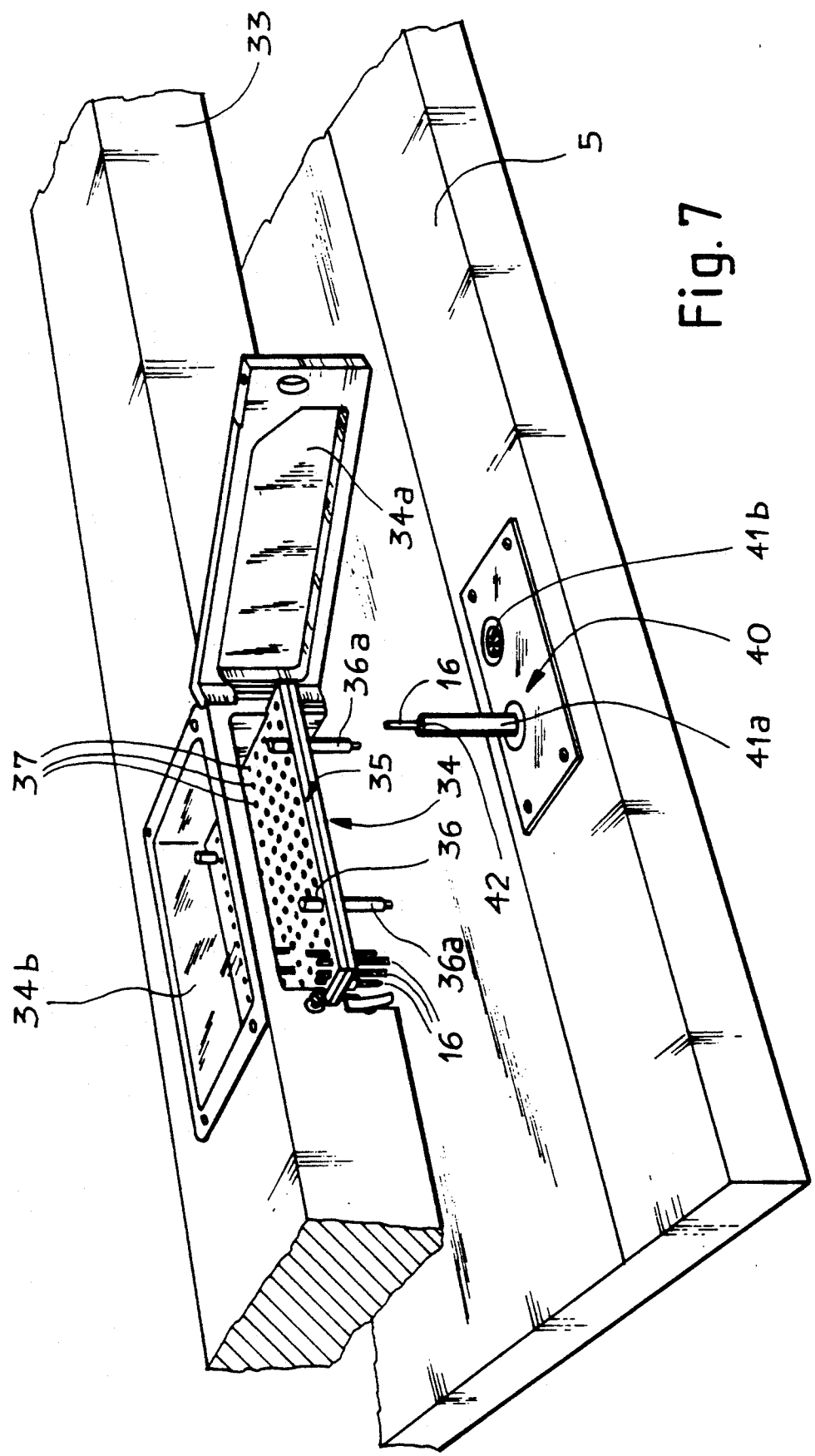
FIG. 7 is a large scale view of a magazine of tools and of their associated transfer means, belonging to each operating unit of the machine.

In the embodiment described, the machine is also provided with automatic tool changing means 16 (FIGS. 1, 3 and 7).

This device has a gantry 30 fixed to the front of the machine on the work surface 4 and oriented along the direction X. Mounted on this gantry which spans the work table 5 are lifting mechanisms 31, the mobile parts 31a of which have mobile supports 32 in vertical translation along the direction Z. These supports form the slides of a scale 33 extending parallel to the gantry 30 and longitudinally mobile in the direction X.

The scale 33 delimits seats 34 (viz: seats 34a to 34f) for the machine tools 35 in the form of a magazine for operating units 12. In another embodiment (not shown) two magazines may be associated with each operating unit, the one being for tools of a certain type and the other designed to contain tools of a different type. An arrangement of this kind can, in certain circumstances, simplify the work of the operator in charge of working the machine. It would, in addition, also be possible to devise an arrangement in which a single magazine would be simultaneously associated with several operating units, or with all the operating units simultaneously.

Each seat 34 can be closed by a door 34a and comprises a fixed transparent cover 34b. The tool magazines are preferably made as described in French patent FR-2,532,226. Thus, as shown in FIG. 7, each tool magazine takes the form of a movable cassette slidably mounted in the form of a drawer in its seat 34 (the cassette is slightly exposed in FIG. 13). The cassette comprises a board 36 in which is provided a matrix network of holes 37 each adapted to receive a tool 16 which can be inserted therein or removed therefrom from underneath when the board 36 is in position in its seating. Means for retaining the shafts of the tools (not shown here) are provided in the board, for example in the same manner as in French patent FR-2,532,226 mentioned hereinabove. Feet 36a make it possible to place the board on a table without disturbing the tools located thereon.

FIG. 3 also shows that the scale 33 is coupled to a screw 38 rotatably mounted in a vertical part integral with the support 32 which is provided to the left of the machine. This screw is, in turn, coupled to a drive motor 39 fixed to the board 32. In this manner, the scale 33 equipped with the magazines can be moved in the direction X.

As also described in French patent FR-2,532,226, the work table comprises several tool transfer means 40 (in the form of items 40a to 40f per operating unit) adapted to facilitate the transport of any tool from a magazine towards the associated operating unit and vice versa, by virtue of movements relative to the work table 5 and of the scale 33 in relation to the respective operating units.

Each transfer device has two tool gripping members 41a, 41b of identical construction. Each has a pincer 42 carried by a vertically mobile piston along the direction Z by a jack for example (not shown on the drawing) in such a way as to be able to retract inside the work table 5 and to project therefrom.

On FIG. 7, one of the gripping members is in the projecting position, whilst the other has been retracted. The door 34a is, moreover, normally closed whilst the machine is in operation.

The presence of two retractable gripping members makes it possible to change the tools very rapidly and with a minimum of handling. One of the members can be used to transport the tool to be used (taken from the magazine) whilst the other can transport the tool which has just been used (taken from the operating unit). One part of the path taken by the used tools and the tools to be used can thus be the same.

To make it easier to load the machine, the supports 32 to which the scale 33 equipped with the tool magazines 35 is suspended can be raised by the elevating means 31 by means of which it is easy to put the boards P in position, singly or in stacks.

The magazines 35 have previously been filled with the tools to be used to machine the boards. In view of their large capacity, the magazines can virtually always contain all the necessary tools, including those to replace used or possibly broken tools. The scale 33 is lowered during working.

Each board or set of boards can thus be machined according to the patterns which may be different or identical as required. The movements to X, Y and Z of the various members of the machine are directed by a numerical control means known per se, that is easily programmable and acts on the various drive means of the machine with the aid of positioning systems provided both for the table 5 and for the operating units 12 to 12f.

It will thus be seen that, due to the invention, the machine can be operated in such a manner that each operating unit 12a to 12f executes successive work cycles that are different from those of the other units, it being understood that the given operations at points of the boards having different coordinates in X can be executed simultaneously.

To this must be added the fact that the distance between the axes of the operating units can be reduced to the minimum standard circuit board module, with the result that the machining can be carried out according to patterns, the width of which (direction X) does not exceed this value.

It is thus possible to work with great flexibility and to increase the rhythm of work without impairing the machining quality.

It should also be noted that the operating units do not all need to be involved at the same time in a series of machining operations, a "parking area" being reserved for them to the left and/or to the right of the actual work area of the machine.

Tool changing cycles follow on from each other as described in above-mentioned French patent FR-2,532,226 with the exception that the relative movements of the operating units 12a to 12f, of the transfer means 40a to 40f and of the tool magazines are effected differently, the movement to X being carried out by movements to X of the scale 33.

Figure 8:
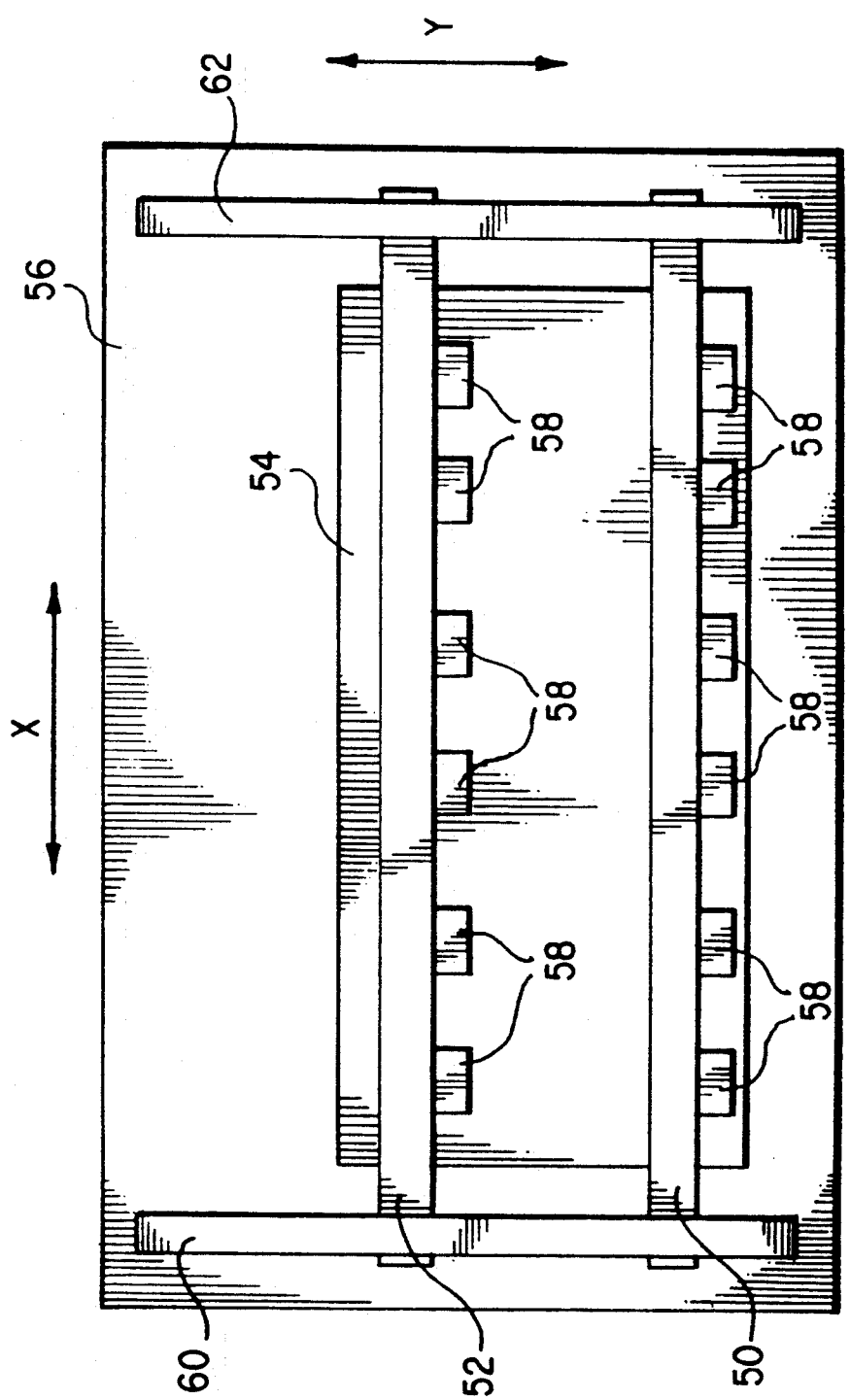
FIG. 8 is a top schematic view of a machine tool according to a second embodiment of the invention.

According to a second embodiment of the invention which is illustrated in FIG. 8 of the drawings, the machine tool comprises a pair of gantries 50 and 52 which span the work table 54. Work table 54 is mounted for movement in the Y direction on the block 56 which forms part of the frame of the machine. The work table 54 and block 56 may be substantially identical to the corresponding components in the embodiment of the invention illustrated in FIGS. 1-7. The gantries 50 and 52 each have six operating units 58 mounted thereon for movement in the X direction. The gantries 50 and 52 may have substantially the same cross sectional shape as the portion of the support 13 and the support beams 14a and 14b which spans the work table 5 in the embodiment of FIGS. 1-7. The operating units 58 may be substantially identical to the operating units 12 illustrated in FIGS. 3, 4 and 6 of the drawings, and are slideably mounted on the gantries 50 and 52. Each of the gantries 50 and 52 also includes a fixed screw (not shown) running its entire length, which is engaged by a rotor of a motor in each of the operating units 58 for independently moving each of the operating units 58 in the X direction. The gantries 50 and 52 are mounted for movement in the Y direction on parallel frame members 60 and 62 which form part of the frame of the machine. Although only two gantries have been shown in the embodiment of the invention illustrated in FIG. 8, it is clear that additional gantries, each carrying a plurality of independently moveable operating units 54, could equally well be provided. This arrangement permits a considerable increase in the speed of operation of the machine tool at the expense of a more complicated design and control system.

We claim:

1. A machine tool in particular for machining printed circuit boards by drilling, milling, shaping and the like, comprising:

a frame;

a work table so as to be movable in at least a first direction on the said frame;

first motor means adapted to move the work table;

at least two operating units adapted to receive tools selectively so as to carry out said machining operations;

guide means affixed to said frame for guiding said operating units in a second direction perpendicular to said first direction;

sliding means cooperating with said guide means and supporting said operating units to enable them to move in said second direction; and second motor means coupled to said sliding means for controlling the movements of said operating units;

said sliding means comprising independent sliding units associated with each operating unit; and said second motor means including a separate motor unit and motor unit control means for each operating unit for independently moving each of said operating units in said second direction, said second motor means including a fixed endless screw extending in said second direction at least along the entire length of the operating areas of the machine tool in said second direction and wherein the motor unit of each operating unit engages said endless screw so as to transmit its drive force to move the operating unit in said second direction independently of the movements of the other operating units.

2. A machine tool for machining printed circuit boards and the like, comprising:

a frame;

a work table mounted for movement in a first direction in the said frame;

first motor means for moving said work table;

a plurality of gantries mounted on said frame spanning said work table and parallel to a second direction perpendicular to said first direction for movement in said first direction;

a plurality of operating units on each of said gantries for selectively receiving tools for carrying out machining operations on objects carried by said work table;

each of said operating units further including sliding means cooperating with said gantries for supporting said operating units for movement in said second direction; and a separate motor unit and motor unit control means for each of said operating units for independently moving each of said operating units in said second direction.

3. A machine tool in particular for machining printed circuit boards by drilling, milling, shaping and the like, comprising:

a frame;

a work table mounted so as to be movable in at least a first direction on the said frame;

first motor means adapted to move the work table;

at least two operating units adapted to receive tools selectively so as to carry out said machining operations;

guide means affixed to said frame for guiding said operating units in a second direction perpendicular to said first direction;

sliding means cooperating with said guide means and supporting said operating units to enable them to move in said second direction;

second motor means coupled to said sliding means for controlling the movements of said operating units;

said sliding means comprising independent sliding units associated with each operating units; and said second motor means including a separate motor unit and motor unit control means for each operating unit for independently moving each of said operating units in said second direction, and an automatic tool changing system which comprises, a tool holder magazine associated with each operating unit, a tool transfer means affixed to said table, and a support scale extending in said second direction and mounted on said frame for adjustment in said second direction, said magazines being mounted on said support scale.

4. A machine tool in particular for machining printed circuit boards by drilling, milling, shaping and the like, comprising:

a frame;

a work table mounted so as to be movable in at least a first direction on the said frame;

first motor means adapted to move the work table;

at least two operating units adapted to receive tools selectively so as to carry out said machining operations;

guide means affixed to said frame for guiding said operating units in a second direction perpendicular to said first direction;

sliding means cooperating with said guide means and supporting said operating units to enable them to move in said second direction;

second motor means coupled to said sliding means for controlling the movements of said operating units;

said sliding means comprising independent sliding units associated with each operating units; and said second motor means including a fixed reaction member and a separate motor unit and motor unit control means for each operating unit for independently moving each of said operating units in said second direction, each of said motor units including an electric motor, the rotor of which engages with the reaction member and the stator of which is fixed in the operating unit.

5. A machine tool according to claim 1, wherein said endless screw extends beyond said operating area in at least one lateral parking area to make it possible to move aside at least one operating unit when its use is temporarily suspended during machining.

6. A machine tool in particular for machining printed circuit boards by drilling, milling, shaping and the like, comprising:

a frame;

a work table mounted so as to be movable in at least a first direction on the said frame;

first motor means adapted to move the work table;

at least two operating units adapted to receive tools selectively so as to carry out said machining operations;

guide means affixed to said frame for guiding said operating units in a second direction perpendicular to said first direction;

sliding means cooperating with said guide means and supporting said operating units to enable them to move in said second direction;

second motor means coupled to said sliding means for controlling the movements of said operating units;

said sliding means comprising independent sliding units associated with each operating units; and said second motor means including a separate motor unit and motor unit control means for each operating unit for independently moving each of said operating units in said second direction, wherein each operating unit includes a housing, said sliding units including sliding members extending laterally from the housing of each operating unit along said second direction, said sliding members resting on said guide means, and wherein said housing has clearances at sites corresponding to the sliding members in such a manner that, when two operating units are brought together, the sliding members overlap in the corresponding clearance of the neighboring unit.

7. A machine tool according to claim 6 wherein the minimum distance between the centre axes of adjacent operating units is equal to or less than the standard modular dimension of integrated circuit boards.

8. A machine tool according to claim 6 wherein each sliding member comprises an air cushioned runner applied to the slide(s).

9. A machine tool according to claim 6 in which said at least one slide member comprises two slides of rectangular section extending parallel to one another in said second direction with a specific longitudinal clearance and wherein each operating unit includes a casing having a generally H shaped profile viewed in said second direction, said sliding members bearing against three adjacent longitudinal faces of each of said slides.

10. A machine tool according to claim 1 which further comprises an incremental linear positioning system associated with said operating units, including a single graduated scale having regular positioning markings over its length, said scale extending in said second direction and wherein each operating unit includes a position meter cooperating with said scale.

11. A machine tool according to claim 10 wherein said scale includes a second set of markings composed of reference markings defining rest positions for the operating units.

12. A machine tool according to claim 11 further including a coded marking associated with each rest position, said coded marking identifying the operating unit which is to rest at such rest position.

13. A machine tool according to claim 3 wherein said scale is also movably mounted in relation to said frame in a direction perpendicular to said first and second directions.

* * * * *